(12) United States Patent
Michalik et al.

(10) Patent No.: US 11,603,378 B2
(45) Date of Patent: Mar. 14, 2023

(54) AZOLE SILANE COMPOUND

(71) Applicant: Atotech Deutschland GmbH, Berlin (DE)

(72) Inventors: Fabian Michalik, Berlin (DE); Stefanie Ackermann, Berlin (DE); Marco Haryono, Berlin (DE); Michael Merschky, Berlin (DE); Thomas Thomas, Berlin (DE); Markku Lager, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 17/253,230

(22) PCT Filed: Jun. 14, 2019

(86) PCT No.: PCT/EP2019/065649
§ 371 (c)(1),
(2) Date: Dec. 17, 2020

(87) PCT Pub. No.: WO2019/243180
PCT Pub. Date: Dec. 26, 2019

(65) Prior Publication Data
US 2021/0277034 A1    Sep. 9, 2021

(30) Foreign Application Priority Data
Jun. 18, 2018    (EP) ..................... 18178331

(51) Int. Cl.
*C07F 7/00* (2006.01)
*H05K 3/28* (2006.01)
*C07F 7/18* (2006.01)

(52) U.S. Cl.
CPC ........... *C07F 7/1892* (2013.01); *H05K 3/282* (2013.01); *H05K 2203/124* (2013.01)

(58) Field of Classification Search
None
See application file for complete search history.

(56) References Cited

U.S. PATENT DOCUMENTS

2016/0368935 A1    12/2016    Miura et al.

FOREIGN PATENT DOCUMENTS

| JP | 06279461 A | 10/1994 |
| JP | 2018016865 A | 2/2018 |

OTHER PUBLICATIONS

PCT/EP2019/065649; PCT International Search Report and Written Opinion of the International Searching Authority dated Aug. 12, 2019.
Balaji J. et al; "Corrosion protection of copper with 3-glycidoxypropyltrimethoxysilane-based sol-gel coating through 3-amino-5-mercapto-1,2,4-triazole doping", Research on Chemical Intermediates: vol. 42, No. 2, May 23, 2015, pp. 1315-1328.
Jurjen Kramer et al; "Recovery of rhodium-containing catalysts by silica-based chelating ion exchangers containing N and S donor atoms", Inorganica Chimica Acta, vol. 315, No. 2, Apr. 1, 2001, pp. 183-190.
Database WPI, Week 199444, Thomson Scientific, London, GB; AN 1994-354748,,XP002786909, & JP H06 279461 A (Japan Energy KK) Oct. 4, 1994.

*Primary Examiner* — Clinton A Brooks
(74) *Attorney, Agent, or Firm* — Renner, Otto, Boisselle & Sklar, LLP

(57) ABSTRACT

The present invention relates to a specific azole silane compound, an oligomer thereof, a mixture comprising said compound and/or said oligomer, as well as a respective storage and working solution. Furthermore, the present invention relates to a synthesis method for said specific azole silane compound, and the use of said working solution as a surface treatment solution.

17 Claims, No Drawings

AZOLE SILANE COMPOUND

The present application is a U.S. National Stage Application based on and claiming benefit and priority under 35 U.S.C. § 371 of International Application No. PCT/EP2019/065649, filed 14 Jun. 2019, which in turn claims benefit of and priority to European Application No. 18178331.7 filed 18 Jun. 2018, the entirety of both of which is hereby incorporated herein by reference.

FIELD OF THE INVENTION

The present invention relates to a specific azole silane compound, an oligomer thereof, a mixture comprising said compound and/or said oligomer, as well as a respective storage and working solution. Furthermore, the present invention relates to a synthesis method for said specific azole silane compound, and the use of said working solution as a surface treatment solution.

BACKGROUND OF THE INVENTION

Azole silane compounds are frequently utilized in the manufacturing of electronic components, in particular in surface treatment solutions, e.g. for the treatment of metal surfaces and surfaces of organic materials as a preparation for further processing steps.

US 2016/0368935 A1 relates to an azole silane compound, and a surface treatment solution using the azole silane compound, a surface treatment method and use thereof.

JP 2018016865 A discloses a triazole surface treatment agent containing a silane compound.

The article "Corrosion protection of copper with 3-glycidoxypropyltrimethoxysilane-based sol-gel coating through 3-amino-5-mercapto-1,2,4-triazole doping", Journal of Research on Chemical Intermediates, Volume 42, Issue 2, pages 1315 to 1328, 2015, discloses a study about corrosion protection of copper in a neutral medium by the formation of a sol-gel coating over the copper surface. It discloses that a 3-amino-5-mercapto-1,2,4-triazole-doped 3-glydidoxypropyltrimethoxysilane-based sol-gel coating on copper forms a thiolate bond to copper.

JPH 06279461 A refers to a surface treating agent for improving rust prevention on a metal surface, particularly a surface treating agent for copper foils used for copper clad laminate boards for printed circuits. The agent is an azole silane obtained by reacting 1H-1,2,4-triazole-3-thiol with 3-glycidoxypropyltrimethoxysilane at 80-200° C.

The article "Recovery of rhodium-containing catalysts by silica-based chelating ion ex-changers containing N and S donor atoms", Journal of Inorganica Chimica Acta 315 (2001), pages 183 to 190 discloses 4-amino-3-methyl-1,2,4-triazole-5-thione attached to the bifunctional spacer (3-glycidoxypropyl)trimethoxysilane prior to immobilization on silica.

Due to the structural diversity of azole silane compounds, the majority of such compounds needs to be manufactured upon request and is typically not readily available as a standard commercial product. Thus, simple and efficient synthesis methods are de-manded.

Typically, azole silane compounds easily polymerize in the presence of water by forming silicon-oxygen-silicon bonds. This is in many cases not desired right after the synthesis of the compound. Although a polymerization might be desired for a final application, usually there is a demand to solubilize freshly synthesized compounds in a solvent such that on the one hand too much and/or too early polymerization of the monomer is prevented but on the other hand allows further processing of the compounds. Furthermore, it is desired to have a sufficiently high concentration of the respective azole silane compound in such a solvent in order to economically ship them to another manufacturing site. As a matter of fact, solubility of known azole silane compounds in typically utilized/desired solvents is often not sufficient.

In addition, in many cases the synthesis of azole silane compounds includes educts comprising halides such as chloride, bromide, and iodide. During the synthesis such halides are often released, contaminating the resulting synthesis product. This typically means that in additional purification steps halides and their respective salts need to be removed. However, such additional steps significantly increase the risk of water contam-ination leading to premature polymerization. Furthermore, such purification steps often negatively affect the over-all yield of the final azole silane compounds. If tolerable, such azole silane compounds are not purified and as a result halides and their respective salts remain together with the azole silane compounds. However, in many applications it is not desired to work at all with an azole silane compound accompanied by halides. In other cases it is not desired to utilize azole silane compounds accompanied by an undefined amount of halides, although halides are generally accepted.

Objective of the Present Invention

It was therefore the first objective of the present invention, based on the above mentioned problems, to provide an azole silane compound with increased solubility in suitable solvents. It was the second objective of the present invention to provide a synthesis method that is simple and efficient, and, above all, does not release halides and respective salts thereof such that additional purifications steps can be avoided.

DESCRIPTION OF THE INVENTION

Above mentioned first objective is solved by an azole silane compound of formula (I)

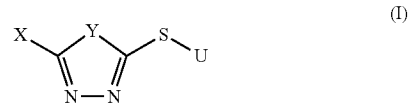

wherein

X denotes $NH_2$, $NH(NH_2)$, $NH(NHU)$, $SH$, $SCH_3$, $OCH_3$, $NHU$, or $SU$, Y denotes $NH$, $N(NH_2)$, $N(NHU)$, or $S$, U independently denotes $CH_2$—$CH(OH)$—$CH_2$—$O$—$(CH_2)_n$—$Si(OR)_3$ with R independently being $(CH_2$—$CH_2$—$O)_m$—$Z$, wherein independently n is an integer in the range from 1 to 12, m is 0, 1, 2, 3, or 4, and Z denotes H or C1 to C5 alkyl.

The second objective is solved by a synthesis method for an azole silane compound of formula (I)

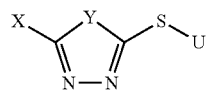

wherein
X denotes NH$_2$, NH(NH$_2$), NH(NHU), SH, SCH$_3$, OCH$_3$, NHU, or SU,
Y denotes NH, N(NH$_2$), N(NHU), or S,
U independently denotes CH$_2$—CH(OH)—CH$_2$—O—(CH$_2$)$_n$—Si(OR)$_3$ with R independently being (CH$_2$—CH$_2$—O)$_m$—Z, wherein independently
n is an integer in the range from 1 to 12,
m is 0, 1, 2, 3, or 4, and
Z denotes C1 to C5 alkyl
the synthesis method comprising the steps of
(i) providing an azole compound of formula (III)

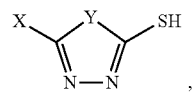

wherein
X denotes NH$_2$, NH(NH$_2$), SH, SCH$_3$, or OCH$_3$,
Y denotes NH, N(NH$_2$), or S,
(ii) providing a silane compound of formula (IV)

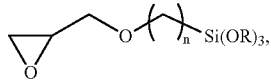

wherein in formula (IV)
R denotes (CH$_2$—CH$_2$—O)$_m$—Z, wherein independently
m is 0, 1, 2, 3, or 4, and
Z denotes C1 to C5 alkyl, and
n is an integer in the range from 1 to 12,
(iii) reacting in a solvent said azole compound with said silane compound such that above compound of formula (I) results, and
(iv) optionally hydrolyzing the compound of formula (I) obtained in step (iii) such that at least one of R is (CH$_2$—CH$_2$—O)$_m$—Z with m=zero and Z=H.

Our own experiments have shown that above mentioned synthesis method leads to azole silane compounds with improved solubility and stability in specific solvents. Furthermore, above synthesis method utilizes educts that are free of halogen atoms. Thus, no halide ions are released during the synthesis into the respective solvent. This is very much desired because even if halide ions are required in further applications, the specific amount of respective halides can be added such that its total concentration is precisely known.

The present invention in particular refers to a specific azole silane compound as defined above. In many cases an azole silane compound of the present invention is preferred, wherein Y denotes NH, N(NH$_2$), or N(NHU), preferably NH and N(NH$_2$), most preferably NH. In other cases an azole silane compound of the present invention is preferred, wherein Y denotes S. Among both, a Y comprising a nitrogen is preferred compared to a Y being S.

An azole silane compound of the present invention is preferred, wherein X denotes NH$_2$, NH(NH$_2$), SH, SCH$_3$, or OCH$_3$, preferably NH$_2$, NH(NH$_2$), SH, or SCH$_3$, more preferably NH$_2$.

An azole silane compound of the present invention is preferred, wherein in U n is an integer in the range from 1 to 8, preferably in the range from 2 to 6, more preferably in the range from 3 to 4, most preferably n is 3.

Very preferred is an azole silane compound of the present invention, being a compound of formula (I-I) or (I-II)

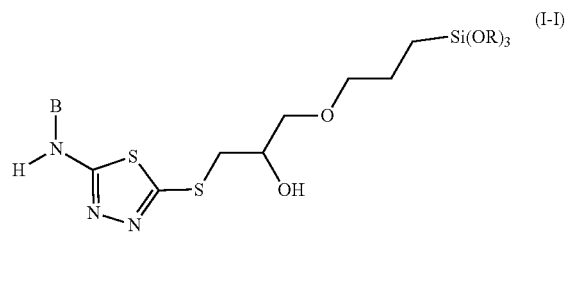

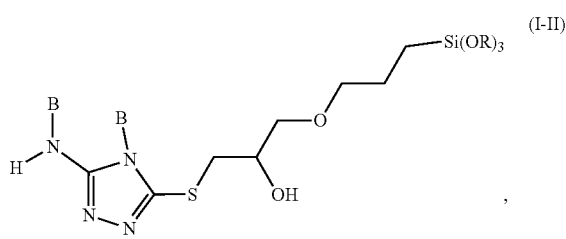

with R independently being (CH$_2$—CH$_2$—O)$_m$—Z,
wherein independently
m is 0, 1, or 2, preferably 0 or 2,
Z denotes H, CHs, CH$_2$—CH$_3$, (CH$_2$)$_2$—CH$_3$, or (CH$_2$)$_3$—CH$_3$, preferably H, CHs, or (CH$_2$)$_3$—CH$_3$, and
B independently being selected from the group consisting of H and NH$_2$, preferably B is H.

Very preferred is a compound of formula (I-II).

In the context of the present invention the term "independently being" (or similar expressions) in combination with a certain variable denotes that a selected feature for such a variable in a first compound is independent from a selected feature of the same variable in a second compound (e.g. variable B in (I-I) and (I-II)) and, if one compound contains the same variable at least twice (e.g. variable B in (I-II)), it is independently selected from each other, and thus can be different. For example, in a compound of formula (I-II) B is independently selected from a B in a compound of formula (I-I). Therefore, both B's can be different. Furthermore, in a compound of formula (I-II) the B connected to the ring azole nitrogen is independently selected from the B in the external amine group. Thus, also in this case both B's can be different in a compound of formula (I-II). This principle likewise applies to other "independently" terms.

More preferred is an azole silane compound of the present invention, being a compound of formula (Ia) or (Ib)

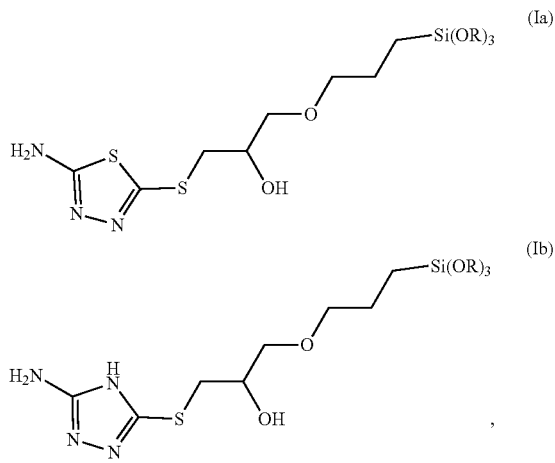

with R independently being (CH$_2$—CH$_2$—O)$_m$—Z,
wherein independently
m is 0, 1, or 2, preferably 0 or 2, and
Z denotes H, CH$_3$, CH$_2$—CH$_3$, (CH$_2$)$_2$—CH$_3$, or (CH$_2$)$_3$—CH$_3$, preferably H, CH$_3$, or (CH$_2$)$_3$—CH$_3$, most preferably H and (CH$_2$)$_3$—CH$_3$.

Most preferred is an azole silane compound of the present invention, wherein Y includes a nitrogen, respectively the azole silane compound of the present invention preferably is a compound of formula (Ib) and (I-II), respectively, as defined above.

The present invention also refers to oligomers of the azole silane compounds of the present invention. Thus, this invention refers to an azole silane oligomer obtained by reacting in the presence of water azole silane compounds according to formula (I)

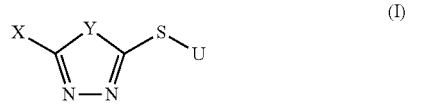

wherein
X denotes H, CH$_3$, NH$_2$, NH(NH$_2$), NH(NHU), SH, SCH$_3$, OCH$_3$, NHU, or SU,
Y denotes NH, N(NH$_2$), N(NHU), or S,
U independently denotes CH$_2$—CH(OH)—CH$_2$—O—(CH$_2$)$_n$—Si(OR)$_3$ with R independently being (CH$_2$—CH$_2$—O)$_m$—Z, wherein independently
n is an integer in the range from 1 to 12,
m is 0, 1, 2, 3, or 4, and
Z denotes H or C1 to C5 alkyl,
(preferably compounds of formula (I) as described throughout the present text as being in particular preferred) with each other such that the azole silane oligomer comprises at least one silicon-oxygen-silicon moiety. This reaction can be also called oligomerization.

Above mentioned oligomerization requires at least a little amount of water for hydrolysis in order to form at least some OH groups at various silicon atoms. Preferably, the azole silane oligomer is obtained by reacting said azole silane compounds with each other in the presence of at least 2 wt.-% of water, based on the total weight of a respective reaction composition.

In the context of the present invention, the term "azole silane oligomer" includes the combination of at least two monomers, i.e. the reaction of at least two azole silane compounds of the present invention with each other. Furthermore, this term includes three, four, five, six, seven, eight, nine and up to 10 monomers. Preferred is an azole silane oligomer of the present invention, wherein the oligomer is selected from the group consisting of an azole silane dimer, an azole silane trimer, an azole silane tetramer, an azole silane pentamer, an azole silane hexamer, an azole silane heptamer, and an azole silane octamer. More preferred is an azole silane oligomer of the present invention, wherein the oligomer is selected from the group consisting of an azole silane dimer, an azole silane trimer, and an azole silane tetramer. The latter alternatively means that an azole silane oligomer of the present invention is preferred, wherein the oligomer comprises one, two, or three silicon-oxygen-silicon moieties, respectively.

On the basis of the azole silane compound of the present invention a huge variety of oligomers of the present invention can be formed. Thus, the oligomers of the present invention are best and fittingly described by their reacting with each other.

In the context of the present invention, the term "at least" in combination with a particular value denotes (and is exchangeable with) this value or more than this value. For example, above mentioned "at least one silicon-oxygen-silicon moiety" denotes (and is exchangeable with) "one or more than one silicon-oxygen-silicon moiety". Most preferably, "at least one" denotes (and is exchangeable with) "one, two, three or more than three".

Most preferred is an oligomer of the present invention, wherein the oligomer is a compound of formula (II)

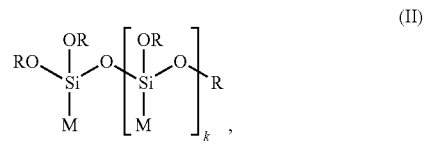

wherein
R independently denotes (CH$_2$—CH$_2$—O)$_m$—Z,
wherein
m is 0, 1, 2, 3, or 4, preferably 0, 1, or 2, and
Z denotes H or C1 to C5 alkyl,
k is 1, 2 or 3, preferably 1 or 2, and
M independently denotes a moiety of formula (IIa)

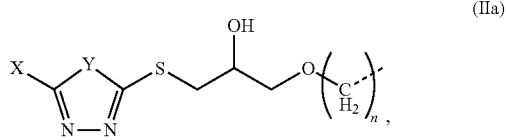

wherein in formula (IIa)
X denotes H, CH$_3$, NH$_2$, NH(NH$_2$), SH, SCH$_3$, or OCH$_3$, preferably CH$_3$, NH$_2$, NH(NH$_2$), SH, SCH$_3$, or OCH$_3$, more preferably NH$_2$, NH(NH$_2$), SH, or SCH$_3$, most preferably NH$_2$,
Y denotes NH, N(NH$_2$), or S, preferably NH, and
n denotes an integer in the range from 1 to 12, preferably in the range from 1 to 8, more preferably in the range from 2 to 6, even more preferably in the range from 3 to 4, most preferably n is 3.

In above moiety of formula (IIa) the dashed line denotes the covalent bond connecting the whole moiety with a silicon atom depicted in formula (II).

Only in a few cases an azole silane oligomer of the present invention is even preferred, wherein k is an integer in the range from 1 to 7, preferably in the range from 1 to 5. However, most preferably k is 1, 2 or 3, preferably 1 or 2.

Preferably, the oligomer of the present invention is a homooligomer. This means that preferably identical monomers are combined with each to form the oligomer.

Alternatively preferred is that in an oligomer of the present invention at least all those moieties not forming the silicon-oxygen-silicon backbone (i.e. the azole moieties and the ether moieties which are linking the azole moieties to the silicon atom) are identical in their chemical formulae. In such a case, M preferably is not independently defined.

The azole silane compound of the present invention and the azole silane oligomer of the present invention can be present as a mixture. Alternatively, more than one compound or more than one oligomer can be present as a mixture. Typically an organic solvent facilitates solubility. Thus, the present invention also refers to a mixture comprising, preferably consisting of, (a)—one or more than one azole silane compound according to the present invention (as described throughout the present text, preferably as described as being preferred), and/or
one or more than one azole silane oligomer according to the present invention (as described throughout the present text, preferably as described as being preferred),
(b)—one or more than one organic solvent.

Preferably the mixture of the present invention is substantially free of, preferably does not comprise, halide ions.

In the context of the present invention, the term "substantially free" of a subject-matter (e.g. a compound, a material, etc.) denotes that said subject-matter is not present at all or is present only in (to) a very little and undisturbing amount (extent) without affecting the intended purpose of the invention. For example, such a subject-matter might be added or utilized unintentionally, e.g. as unavoidable impurity. "Substantially free" preferably denotes 0 (zero) ppm to 50 ppm, based on the total weight of the mixture (if defined for said mixture), preferably 0 ppm to 25 ppm, more preferably 0 ppm to 10 ppm, even more preferably 0 ppm to 5 ppm, most preferably 0 ppm to 1 ppm. Zero ppm denotes that a respective subject-matter is not comprised at all, which is most preferred. This principle applies likewise to other aspects of the present invention, e.g. the storage solution of the present invention (see text below) and the working solution of the present invention (see also text below).

Preferred is a mixture of the present invention, wherein in said mixture the total amount of all azole silane compounds of the present invention and oligomers of the present invention together is in the range from 5 wt.-% to 30 wt.-%, based on the total weight of said mixture, preferably is in the range from 8 wt.-% to 26 wt.-%, more preferably is in the range from 12 wt.-% to 24 wt.-%, even more preferably is in the range from 15 wt.-% to 21 wt.-%, most preferably is in the range from 17 wt.-% to 20 wt.-%. Preferably the mixture is substantially free of, preferably does not comprise, any other azole silane comic) pounds and azole silane oligomers, respectively, not being according to the present invention.

Very preferred is a mixture of the present invention, wherein said mixture is substantially free of, preferably does not comprise, water. Thus, preferred is a mixture of the present invention, wherein the one or more than one azole silane compound according to the present invention is substantially free of, preferably does not comprise, —SiOH groups.

Preferred is a mixture of the present invention, wherein the one or more than one organic solvent comprises a solvent selected from the group consisting of acetone, 1,3-dioxolane, acetonitrile, 1,4-dioxane, methanol, ethanol, 1-propanol, 2-propanol, t-butanol, prop-2-en-1-ol, ethyl lactate, ethylene glycol monomethyl ether acetate, N,N-dimethylformamide, 2-butoxyethanol, di(propylene glycol) methyl ether, tetrahydrofurfuryl alcohol, N-methyl-2-pyrrolidone, 2-(2-methoxyethoxy)ethanol, gamma-butyrolactone, ethylene glycol, propylene glycol, dipropylene glycol, epsilon-caprolactone, diethylene glycol monobutyl ether, ethylene glycol monobutyl ether, tetrahydrothiophene-1-oxide, diethylene glycol monobutyl ether acetate, propylene carbonate, sulfolane, glycerol, and mixtures thereof.

Very preferred is a mixture of the present invention, wherein the one or more than one organic solvent comprises a solvent selected from the group consisting of methanol, ethanol, 1-propanol, 2-propanol, t-butanol, di(propylene glycol) methyl ether, ethylene glycol, propylene glycol, dipropylene glycol, diethylene glycol monobutyl ether, ethylene glycol monobutyl ether, and mixtures thereof.

In a few cases very preferred is a mixture of the present invention, wherein the one or more than one organic solvent comprises a solvent selected from the group consisting of glycol ethers, preferably selected from the group consisting of di(propylene glycol) methyl ether, diethylene glycol monobutyl ether, ethylene glycol monobutyl ether, and mixtures thereof.

In the context of the present invention, above defined mixture of the present invention is preferably a direct result of a respective synthesis procedure such as the synthesis method of the present invention (for more details see below).

Furthermore, preferred is a mixture according to the present invention (as described throughout the present text, preferably as described as being preferred), wherein all azole silane compounds according to the present invention (as described throughout the present text, preferably as described as being preferred) and all azole silane oligomers according to the present invention (as described throughout the present text, preferably as described as being preferred) represent at least 51 mol-% of all compounds comprising at least one silicon atom in said mixture, preferably represent at least 60 mol-%, more preferably represent at least 70 mol-%, most preferably represent at least 80 mol-%, even most preferably represent at least 90 mol-%. The aforementioned preferably applies likewise to the alkaline storage solution of the present invention (see text below) and the aqueous working solution of the present invention (see text below), respectively.

The present invention also refers to an alkaline storage solution comprising
(a)—one or more than one azole silane compound according to the present invention (as described throughout the present text, preferably as described as being preferred), and
optionally one or more than one azole silane oligomer according to the present invention (as described throughout the present text, preferably as described as being preferred),
(b)—water,
(c)—one or more than one water miscible organic solvent, with the proviso that the pH is 9 or higher.

Preferably the alkaline storage solution of the present invention is substantially free of, preferably does not comprise, halide ions. Only in a few cases it is preferred that halide ions are present by intentionally adding halide ions, preferably by intentionally adding chloride ions.

Preferred is a storage solution of the present invention, wherein in the solution the total amount of all azole silane compounds according to the present invention (as described throughout the present text, preferably as described as being preferred) and all azole silane oligomers according to the present invention (as described throughout the present text, preferably as described as being preferred) together is in the range from 0.5 wt.-% to 15 wt.-%, based on the total weight of the alkaline storage solution, preferably is in the range from 0.8 wt.-% to 12 wt.-%, more preferably is in the range from 1.0 wt.-% to 10 wt.-%, even more preferably is in the range from 1.5 wt.-% to 8 wt.-%, most preferably is in the range from 2.2 wt.-% to 6 wt.-%.

Above described storage solution contains water. Preferred is a storage solution of the present invention, wherein in the alkaline storage solution water is present in a total amount in the range from 10 wt.-% to 80 wt.-%, based on the total weight of the alkaline storage solution, preferably in the range from 15 wt.-% to 78 wt.-%, more preferably in the range from 20 wt.-% to 76 wt.-%, even more preferably in the range from 33 wt.-% to 74 wt.-%, most preferably in the range from 38.6 wt.-% to 70 wt.-%.

Except water, the alkaline storage solution contains one or more than one water miscible organic solvent. Such an organic solvent facilitates the needed solubility of the respective azole silane compounds and its oligomers, particular if they are present at comparatively higher concentrations (e.g. up to and around 15 wt.-%, see text above). Thus, preferred is a storage solution of the present invention, wherein in said solution the one or more than one water miscible organic solvent is present in a total amount in the range from 5 wt.-% to 89.5 wt.-%, based on the total weight of the alkaline storage solution, preferably in the range from 10 wt.-% to 84.2 wt.-%, more preferably in the range from 14 wt.-% to 79 wt.-%, even more preferably in the range from 18 wt.-% to 65.5 wt.-%, most preferably in the range from 24 wt.-% to 59 wt.-%.

In many cases an alkaline storage solution of the present invention is preferred, wherein the total weight of water is lower than the total weight of all water miscible organic solvents.

As mentioned above, said storage solution is alkaline. In the context of the present invention this means that the pH is 9 or higher. Preferred is a storage solution of the present invention, wherein the solution has a pH of 9.6 or more, preferably the pH is in the range from 10.4 to 13, more preferably the pH is in the range from 10.5 to 12.4, most preferably the pH is in the range from 10.6 to 11.9. If the pH is significantly below pH 9 the solubility of the azole silane compounds and its oligomers is reduced, even up to the point of undesired precipitation. An acidic pH is not suitable for storage purposes because at such a pH precipitation has been observed in many cases with comparatively high concentrations of silane azole compounds of the present invention and its corresponding oligomers. On the contrary, if the pH is significantly above 13, an undesired phase separation and degradation of the azole silane compounds is frequently observed.

In the context of the present invention, the pH is referenced to a temperature of 20° C.

In the alkaline storage solution of the present invention, the alkaline pH is obtained by preferably utilizing at least one alkaline hydroxide, most preferably by utilizing sodium hydroxide.

The alkaline pH does not only allow comparatively high concentrations of said azole silane compounds and its oligomers, respectively, in the storage solution. It furthermore strongly maintains the azole silane compounds of the present invention in its monomeric state and significantly reduces the formation of azole silane oligomers of the present invention. However, if such an oligomer is formed in the alkaline storage solution of the present invention, it is typically quickly hydrolyzed to form its monomeric forms due to the alkaline pH. In the storage solution of the present invention this is desired.

Preferred is a storage solution of the present invention, wherein in said solution the total weight of all azole silane compounds according to the present invention is higher than the total weight of all azole silane oligomers according to the present invention.

In some cases a storage solution of the present invention is preferred, wherein for at least 80 wt.-% of the total weight of all azole silane compounds according to the present invention Z is H and m is zero, preferably for at least 90 wt.-%, most preferably for at least 95 wt.-%. This means that in the storage solution the azole silane compound is mostly present in its hydrolyzed form comprising SiOH-groups.

Above mentioned alkaline storage solution is in particular suitable in order to transport and/or storage the one or more than one azole silane compound of the present invention. However, in order to utilize said compounds, for example as a surface treatment solution in the production of electronic parts, a respective working solution is preferred. Thus, the present invention further relates to an aqueous working solution having a pH in the range from 4.8 to 8.0, the solution comprising (a)—one or more than one azole silane compound according to the present invention (as described throughout the present text, preferably as described as being preferred), and/or
one or more than one azole silane oligomer according to the present invention (as described throughout the present text, preferably as described as being preferred), (b)—at least 51 wt.-% water, based on the total weight of said working solution, (c)—one or more than one water miscible organic solvent, wherein in said working solution the total amount of all azole silane compounds according to the present invention (as described throughout the present text, preferably as described as being preferred) and all azole silane oligomers according to the present invention (as described throughout the present text, preferably as described as being preferred) together is 5 wt.-% or less, based on the total weight of the aqueous working solution.

In particular preferred is an aqueous working solution of the present invention with the proviso that said working solution comprises at least one azole silane oligomer according to the present invention (as described throughout the present text, preferably as described as being preferred). This is in particular preferred for freshly prepared working solutions.

Above term "5 wt.-% or less" does not include zero wt.-%. This means that said total amount is always >0 wt.-%, preferably at least 0.1 wt.-%.

Preferred is a working solution of the present invention, wherein in said working solution the total amount of all azole silane compounds according to the present invention (as described throughout the present text, preferably as described as being preferred) and all azole silane oligomers according to the present invention (as described throughout the present text, preferably as described as being preferred) together is in the range from 0.1 wt.-% to 4 wt.-%, based on the total weight of the aqueous working solution, preferably is in the range from 0.2 wt.-% to 3 wt.-%, more preferably is in the range from 0.3 wt.-% to 2.2 wt.-%, even more preferably in the range from 0.4 wt.-% to 2.0 wt.-%, most preferably is in the range from 0.5 wt.-% to 1.8 wt.-%.

Own experiments have shown that the individual presence of the one or more than one azole silane compound according to the present invention and the one or more than one azole silane oligomer according to the present invention varies over time. In a freshly prepared working solution typically the total weight of azole silane compounds of the present invention is higher than the total weight of azole silane oligomers of the present invention. However, over time upon utilizing the working solution the total weight of said azole silane oligomers drastically increases, possibly even up to the point that the total weight of said azole silane oligomers is higher than the total weight of said azole silane compounds. Furthermore, the handling of the working solution of the present invention also affects the total weights of said compounds and oligomers, respectively. For example, a significant drag out during utilizing the working solution and a corresponding replenishment with fresh working solution typically leads to a steady state condition in terms of azole silane compound(s) vs. azole silane oligomer(s).

Most preferably, the working solution of the present invention comprises
- one or more than one azole silane compound according to the present invention (as described throughout the present text, preferably as described as being preferred), and
- one or more than one azole silane oligomer according to the present invention (as described throughout the present text, preferably as described as being preferred). Thus, a respective working solution comprising at least one compound and at least one oligomer is most preferred.

The working solution of the present invention has a pH in the range from 4.8 to 8.0. Preferred is a working solution of the present invention, wherein the pH is in the range from 5.6 to 7.9, more preferably in the range from 5.8 to 7.7, most preferably in the range from 6.5 to 7.5. A pH in the range from 4.8 to 8.0 supports at least to a certain degree an oligomerization of the azole silane compounds of the present invention, which is desired (but which is not desired in the storage solution). Furthermore, a total amount of all azole silane compounds according to the present invention and all azole silane oligomers according to the present invention of 5 wt.-% or less, based on the total weight of the aqueous working solution, and said working solution primarily being an aqueous solution, results in a sufficiently stable working solution. This means that with such a total amount and such a pH in an aqueous environment precipitation can be significantly avoided. For example, if the pH is significantly below pH 4.8 or significantly above pH 8.0 undesired and strong precipitation is often observed.

As already mentioned, the working solution of the present invention is an aqueous solution. Preferred is a working solution of the present invention, wherein in said solution water is present in a total amount in the range from 56 wt.-% to 88 wt.-%, based on the total weight of the aqueous working solution, preferably in a total amount in the range from 60 wt.-% to 84.8 wt.-%, more preferably in a total amount in the range from 65 wt.-% to 82.2 wt.-%.

In order to sufficiently solubilize the azole silane compounds of the present invention and the azole silane oligomers of the present invention in the aqueous working solution of the present invention, one or more than one water miscible organic solvent is present. Preferred is a working solution of the present invention, wherein in said solution the one or more than one water miscible organic solvent is present in a total amount in the range from 6 wt.-% to 44 wt.-%, based on the total weight of the aqueous working solution, preferably in a total amount in the range from 8 wt.-% to 43.9 wt.-%, more preferably in a total amount in the range from 13 wt.-% to 39.7 wt.-%, most preferably in a total amount in the range from 16 wt.-% to 34.5 wt.-%.

As mentioned above, in the context of the present invention azole silane compounds of the present invention as well as azole silane oligomers of the present invention are initially free of halides. This means on the one hand that said compounds and oligomers, respectively, are in itself free of halide atoms because no educts containing halogen atoms are utilized, and on the other hand no halide ions are present in the immediate synthesis environment. However, in a few cases it is preferred that the aqueous working solution of the present invention comprises a precisely defined amount of halide ions. Therefore, in some cases an aqueous working solution of the present invention is preferred further comprising
  (d)—halide ions, preferably chloride ions.

However, in other cases it is preferred that the aqueous working solution of the present invention is substantially free of, preferably does not comprise, chloride ions, more preferably is substantially free of, preferably does not comprise, halide ions.

One or more than one water miscible organic solvent is present in both the alkaline storage solution of the present invention and the aqueous working solution of the present invention. Preferred is an alkaline storage solution according to the present invention (as described throughout the present text, preferably as described as being preferred), or an aqueous working solution according to the present invention (as described throughout the present text, preferably as described as being preferred), wherein the one or more than one water miscible organic solvent comprises a water-miscible organic solvent selected from the group consisting of C1 to C4 alcohols, glycol ethers, and mixtures thereof, preferably selected from the group consisting of
- C1 to C3 alcohols,
- HO—(CH$_2$—CH$_2$—O)$_m$—Z, wherein
  - m is 1, 2, 3, or 4, preferably 1 or 2, and
  - Z denotes C1 to C5 alkyl, preferably C3 to C5 alkyl,
- and mixtures thereof, more preferably
- selected from the group consisting of methanol, diethylene glycol monobutyl ether, ethylene glycol monobutyl ether, and mixtures thereof, even more preferably selected from the group consisting of diethylene glycol monobutyl ether, ethylene glycol monobutyl ether, and mixtures thereof.

The above defined water-miscible organic solvents likewise apply to the synthesis method of the present invention (see text below).

In each case, glycol ethers are more preferred than alcohols. Glycol ethers typically provide an improved stabilization compared to said alcohols. Furthermore, alcohols in general exhibit a low flash point compared to glycol ethers, which makes alcohols potentially dangerous in terms of fire hazard. A comparatively high flash point is usually desired in order to prevent an ignition. Thus, glycol ethers typically provide the desired solubility, stability and security. This principle preferably applies likewise to the mixture of the present invention, the alkaline storage solution of the present invention, and the synthesis method of the present invention (see text below).

Preferred is an alkaline storage solution according to the present invention (as described throughout the present text, preferably as described as being preferred), or an aqueous working solution according to the present invention (as described throughout the present text, preferably as described as being preferred), wherein all azole silane compounds according to the present invention (as described throughout the present text, preferably as described as being preferred) and all azole silane oligomers according to the present invention (as described throughout the present text, preferably as described as being preferred) represent at least 70 wt.-% of the total weight of all azole silane compounds and oligomers in said storage solution and said working solution, respectively, preferably represent at least 80 wt.-%, more preferably represent at least 90 wt.-%, even more preferably represent at least 93 wt.-%, most preferably represent at least 95 wt.-%, even most preferably represent at least 98 wt.-%. It is most preferred that no other azole silane compounds or oligomers are present, except those according to the present invention. This also means that the absolute total amounts of azole silane compounds and azole silane oligomers together (as defined in the very text above) very preferably apply with the proviso that no other azole silane compounds and azole silane oligomers are present in the alkaline storage solution of the present invention and aqueous working solution of the present invention, respectively.

Furthermore, preferred is an alkaline storage solution according to the present invention (as described throughout the present text, preferably as described as being preferred), or an aqueous working solution according to the present invention (as described throughout the present text, preferably as described as being preferred), wherein all azole silane compounds according to the present invention (as described throughout the present text, preferably as described as being preferred) and all azole silane oligomers according to the present invention (as described throughout the present text, preferably as described as being preferred) represent at least 51 mol-% of all compounds comprising at least one silicon atom in said storage solution and said working solution, respectively, preferably represent at least 60 mol-%, more preferably represent at least 70 mol-%, most preferably represent at least 80 mol-%, even most preferably represent at least 90 mol-%.

The present invention also relates to a synthesis method for an azole silane compound of formula (I)

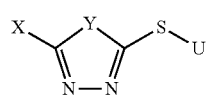

(I)

wherein
X denotes $NH_2$, $NH(NH_2)$, $NH(NHU)$, SH, $SCH_3$, $OCH_3$, NHU, or SU,
Y denotes NH, $N(NH_2)$, N(NHU), or S,
U independently denotes $CH_2$—CH(OH)—$CH_2$—O—$(CH_2)_n$—$Si(OR)_3$ with R independently being $(CH_2$—$CH_2$—O$)_m$—Z, wherein independently
n is an integer in the range from 1 to 12,
m is 0, 1, 2, 3, or 4, and
Z denotes C1 to C5 alkyl
the synthesis method comprising the steps of
(i) providing an azole compound of formula (III)

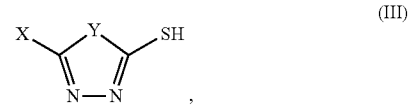

(III)

wherein
X denotes $NH_2$, $NH(NH_2)$, SH, $SCH_3$, or $OCH_3$,
Y denotes NH, $N(NH_2)$, or S,
(ii) providing a silane compound of formula (IV)

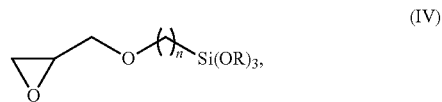

(IV)

wherein in formula (IV)
R denotes $(CH_2$—$CH_2$—O$)_m$—Z, wherein independently
m is 0, 1, 2, 3, or 4, and
Z denotes C1 to C5 alkyl, and
n is an integer in the range from 1 to 12,
(iii) reacting in a solvent said azole compound with said silane compound such that above defined compound of formula (I) results, and
(iv) optionally hydrolyzing the compound of formula (I) obtained in step (iii) such that at least one of R is $(CH_2$—$CH_2$—O$)_m$Z with m=zero and Z=H.

The above mentioned regarding the azole silane compound of the present invention (preferably as described as being preferred) preferably applies likewise to the synthesis method of the present invention, e.g. regarding very preferred azole silane compounds of the present invention.

Step (iv) is optional and includes the presence of at least some water in order to hydrolyze the compound obtained in step (iii) of the method of the present invention. Preferably, such water is added after step (iii) in an additional step, e.g. step (iv). If such a compound is desired (m=zero and Z=H), step (iv) is not optional.

Very preferred is a synthesis method of the present invention, wherein in step (iii) the solvent comprises an organic solvent, more preferably is one or more than one organic solvent, most preferably is one or more than one water miscible organic solvent.

In many cases a synthesis method of the present invention is preferred, wherein in step (iii) the solvent is one or more than one solvent selected from the group consisting of C1 to C4 alcohols, glycol ethers, and mixtures thereof, preferably selected from the group consisting of C1 to C3 alcohols, HO—$(CH_2$—$CH_2$—$O)_m$—Z, wherein m is 1, 2, 3, or 4, preferably is 1 or 2, and Z denotes C1 to C5 alkyl, preferably C3 to C5 alkyl, and mixtures thereof, more preferably selected from the group consisting of methanol, diethylene glycol monobutyl ether, ethylene glycol monobutyl ether, and mixtures thereof, even more preferably selected from the group consisting of diethylene glycol monobutyl ether, ethylene glycol monobutyl ether, and mixtures thereof.

Generally, glycol ethers are more preferred than above defined alcohols (for reasons see text above). Thus, a respective synthesis method of the present invention is preferred.

Preferred is a synthesis method of the present invention (in particular as described before), wherein the solvent in step (iii) is substantially free of, preferably does not comprise, water.

Preferably, the solvent in step (iii) is one or more than one organic solvent and after step (iii) of the method of the present invention a mixture according to the present invention is obtained (for the mixture see text above). The aforementioned regarding the mixture of the present invention applies likewise to the synthesis method of the present invention.

Preferred is a synthesis method of the present invention, wherein the total molar ratio of the compound of formula (III) to the compound of formula (IV) is in the range from 1:0.85 to 1:1.3, preferably in the range from 1:0.90 to 1:1.25, more preferably in the range from 1:0.95 to 1:1.2, most preferably in the range from 1:1.0 to 1:1.15. If the total molar ratio is significantly higher than 1:1.3 the synthesis product is not sufficiently stable. If the total molar ratio is significantly lower than 1:0.85 too much unreacted educts are present in the synthesis product, which is not desired because the desired species is the azole silane compound comprising the azole and the silane moiety. This principle preferably applies likewise to the mixture of the present invention, the alkaline storage solution of the present invention, and the aqueous working solution of the present invention.

Preferred is a synthesis method of the present invention, wherein in step (iii) the temperature is in the range from 50° C. to 90° C., preferably in the range from 60° C. to 85° C.

Preferred is a synthesis method of the present invention, wherein in step (i) the azole compound of formula (III) is provided as a suspension. This means that it is preferred to suspend the azole compound of formula (III) in at least one solvent such that said azole compound and said at least one solvent form said suspension. For that it is preferred that the at least one solvent is one or more than one organic solvent, preferably is one or more than one water miscible organic solvent. Very preferably the at least one solvent utilized to form said suspension is identical to the solvent utilized in step (iii). Most preferred, the azole compound of formula (III) is suspended in one or more than one solvent selected from the group consisting of C1 to C4 alcohols, glycol ethers, and mixtures thereof, preferably selected from the group consisting of C1 to C3 alcohols, HO—$(CH_2$—$CH_2$—$O)_m$—Z, wherein m is 1, 2, 3, or 4, preferably is 1 or 2, and Z denotes C1 to C5 alkyl, preferably C3 to C5 alkyl, and mixtures thereof, more preferably selected from the group consisting of methanol, diethylene glycol monobutyl ether, ethylene glycol monobutyl ether, and mixtures thereof, most preferably selected from the group consisting of diethylene glycol monobutyl ether, ethylene glycol monobutyl ether, and mixtures thereof.

Preferred is a synthesis method of the present invention, wherein in step (iii) the reacting is carried out for 1 hour to 48 hours, preferably for 3 hours to 24 hours, more preferably for 5 hours to 20 hours.

The present invention also relates to the specific use of above mentioned working solution of the present invention (as described throughout the present text, preferably as described as being preferred) as a surface treatment solution, preferably for treating a metal surface and/or a surface of an organic material. Preferably both, the metal surface and the organic material are included in the manufacturing of electronic components.

The invention is further explained by the following non-limiting examples.

EXAMPLES

A) Synthesis of Azole Silane Compounds of Formula (I):
1) Synthesis of Azole Silane Compound of Formula (Ia):

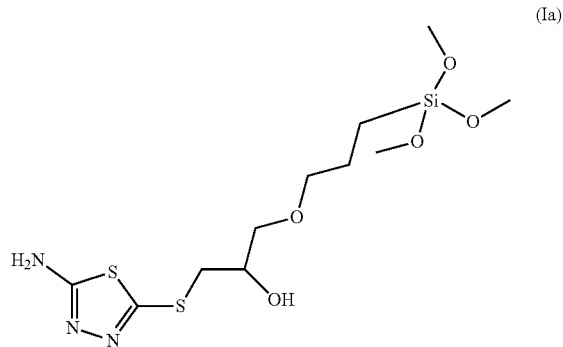 [SMILES: CO[Si](CCCOCC(O)CSc1nnc(N)s1)(OC)OC]

(Ia)

In a first step, 3.68 g (27.1 mmol) 5-amino-1,3,4-thiadiazole-2-thiol (azole compound of formula (III), wherein X denotes $NH_2$ and Y denotes S) were suspended in 70 ml methanol and an azole suspension was obtained.

In a second step, a solution made by dissolving 6.59 g (27.1 mmol) 3-glycidoxypropyltrimethoxysilane (silane compound of formula (IV), wherein R denotes $CH_3$ and n is 3) in 20 ml methanol was added to the azole suspension. As a result, a reaction suspension was obtained.

In a third step, the reaction suspension was heated to reflux (temperature approximately 65° C.) for 18 hours. During that time the suspension turned into a clear solution indicating that the azole compound was fully used up. Afterwards, the solvent (methanol) was removed and approximately 10 g (yield 100%) of a yellow, highly viscous substance were obtained as product, primarily being the azole silane compound of formula (Ia). The thus obtained product was free of any halides and utilized without further purification.

¹H NMR: (400 MHz, DMSO-d₆) δ 7.24 (s, 2H), 5.22 (d, J=5.4 Hz, 1H), 3.81 (dq, J=7.1, 5.2 Hz, 1H), 3.51-3.43 (m, 8H), 3.41-3.30 (m, 5H), 3.30-3.13 (m, 2H), 3.05 (dd, J=13.1, 7.1 Hz, 1H), 1.59-1.44 (m, 2H), 0.68-0.51 (m, 2H)

ESI-MS: m/z: 369.08 (100.0%), 370.09 (11.9%), 371.08 (9.0%)

Both NMR and ESI-MS confirm the presence of the azole silane compound of formula (Ia). The theoretical molar mass is 369 g/mol.

2) Synthesis of Azole Silane Compound of Formula (Ib):

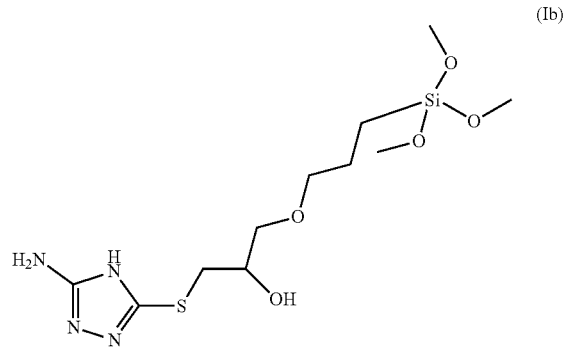 [SMILES: CO[Si](CCCOCC(O)CSc1nnc(N)[nH]1)(OC)OC]

In a first step, 3.36 g (28.4 mmol) 5-amino-4H-1,2,4-triazole-3-thiol (azole compound of formula (III), wherein X denotes $NH_2$ and Y denotes NH) were suspended in 70 ml methanol and an azole suspension was obtained.

In a second step, a solution made by dissolving 6.91 g (28.4 mmol) 3-glycidoxypropyltrimethoxysilane (silane compound of formula (IV), wherein R denotes $CH_3$ and n is 3) in 20 ml methanol was added to the azole suspension. As a result, a reaction suspension was obtained.

In a third step, the reaction suspension was heated to reflux (temperature approximately 65° C.) for 18 hours. During that time the suspension turned into a clear solution indicating that the azole compound was fully used up. Afterwards, the solvent (methanol) was removed and approximately 10 g (yield 100%) of a yellow, highly viscous substance were obtained as product, primarily being the azole silane compound of formula (Ib). The thus obtained product was free of any halides and utilized without further purification.

¹H NMR: (400 MHz, DMSO-d₆) δ 6.03 (s, 2H), 5.33-5.08 (m, 1H), 3.87-3.75 (m, 1H), 3.54-3.25 (m, 13H), 3.22-3.08 (m, 1H), 2.97 (dd, J=13.3, 7.0 Hz, 1H), 1.55 (dddd, J=12.7, 11.1, 6.6, 3.5 Hz, 2H), 0.67-0.50 (m, 2H)

ESI-MS: m/z: 352.12 (100.0%), 353.13 (11.9%)

Both NMR and ESI-MS confirm the presence of the azole silane compound of formula (Ib). The theoretical molar mass is 352 g/mol.

Above mentioned synthesis of azole silane compound of formula (Ib) was carried out additionally in varying molar rations between the azole compound of formula (III) and the silane compound of formula (IV), such as molar ratios of 1:1.1 and 1:0.9.

3) Synthesis of Azole Silane Compound of Formula (Ib) in DEGBE:

In a first step, 3.36 g (28.4 mmol) 5-amino-4H-1,2,4-triazole-3-thiol (azole compound of formula (III), wherein X denotes $NH_2$ and Y denotes NH) were suspended in 35 ml diethylene glycol monobutyl ether (DEGBE) and an azole suspension was obtained.

In a second step, a solution made by dissolving 6.91 g (28.4 mmol) 3-glycidoxypropyltrimethoxysilane (silane compound of formula (IV), wherein R denotes $CH_3$ and n is 3) in 10 ml DEGBE was added to the azole suspension. As a result, a reaction suspension was obtained.

In a third step, the reaction suspension was heated to 80° C. for 15 hours. During that time the suspension turned into a clear solution indicating that the azole compound was fully used up. Afterwards, a reaction product with a concentration of approximately 18 wt.-% in DEGBE was obtained. The thus obtained product was completely free of any halides and utilized without further purification. Furthermore, no change or removal of solvent was needed as for example described above in examples 1 and 2.

ESI-MS confirms the formation of a compound comprising three methoxy groups connected to the silicon atom. In addition, compounds comprising one, two, or three DEGBE moieties instead of respective methoxy groups also have been identified.

B) Synthesis of a Reference Azole Silane Compound (not According to the Present Invention)

For a comparison, a reference azole silane compound of formula (X) was synthesized

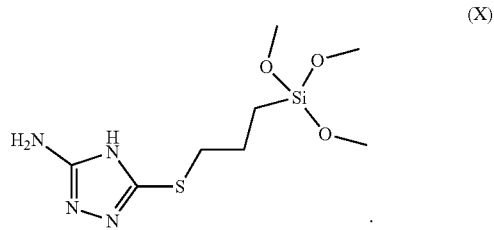 [SMILES: CO[Si](CCCSc1nnc(N)[nH]1)(OC)OC]

Reference compound of formula (X) is disclosed in US 2016/0368935 A1 as compound (1-8). Synthesis of this reference compound was based on Example 1-8 in US 2016/0368935 A1 and carried out as follows:

In a first step, 5-amino-1,3,4-thiadiazole-2-thiol was deprotonated in a strongly alkaline aqueous solution utilizing NaOH. Afterwards the solvent (water) was removed and the product was dried. As a result, the sodium salt of 5-amino-1,3,4-thiadiazole-2-thiol was obtained.

In a second step, said sodium salt was transferred into dimethylformamide (DMF) and 3-chloropropyltrimethoxysilane (dissolved in DMF) was added to form a reaction mixture. The reaction mixture was heated under reflux to approximately 100° C. for 15 hours. During that time insoluble sodium chloride precipitated contaminating the desired product. Sodium chloride was at least partly removed by filtration additionally resulting in a loss of product (up to 5%). As a result, a yellow, highly viscous substance was obtained.

C) Solubility and Stability Tests:

C-1 Solubility Test:

In a solubility test, solubility in diethylene glycol monobutyl ether (DEGBE) and ethylene glycol monobutyl ether (EGBE) as solvents was tested at approximately 22° C. under constant stirring. For that, the azole silane compound of Formula (Ia), obtained in Example A), 1), and the reference compound of formula (X) were dissolved in respective samples (mixtures).

In each solubility test the time "t" was determined until an amount of the respective compound in its highly viscous state, corresponding in each case to a concentration of 50 g/L of the azole silane compound (approximately corresponding to 5 wt.-%, based on the total weight of a respective test composition), was fully dissolved in the respective solvent. Each solubility test was carried out for 30 minutes.

The results are summarized in the following Table 1.

TABLE 1

| Compound | t [min] | |
|---|---|---|
| of formula | DEGBE | EGBE |
| (Ia) | 12 | 10 |
| (X) | 25 | — |

The sample comprising the compound of formula (Ia) is a mixture according to the present invention, wherein the sample comprising the compound of formula (X) is a mixture not according to the present invention.

A complete dissolution and a clear homogeneous solution was not at all obtained with reference compound of formula (X) in EGBE. Even after 30 minutes residues of the yellow, highly viscous substance were still present, indicating that the compound of formula (X) was not fully solubilized in EGBE. In contrast, a complete solubilization was achieved for the compound of formula (Ia) after 10 minutes. A clear, colorless, homogeneous solution was obtained. Furthermore, the presence of contaminating halide ions can be fully excluded.

In DEGBE complete solubilization of the reference compound took approximately twice the time compared to the compound of formula (Ia). A clear and color-less solution was obtained with the azole silane compound of formula (Ia) in DEGBE already after 12 minutes. Furthermore, the presence of contaminating halide ions can be fully excluded.

The presence of contaminating halide ions cannot completely excluded in case of reference compound (X).

As a result, the azole silane compound of formula (I) according to the present invention shows significantly increased solubility in specific organic solvents (glycol ethers) compared to known azole silane compounds.

C-2 Stability Test:

C-2i) Alkaline Storage Solution:

In a first stability test, stability of a compound of formula (Ib) obtained in Example A), 3) was further investigated in dependence of the pH.

For that purpose, various storage solutions (according to the present invention and not according to the present invention) have been prepared each comprising 200 mL/L water (corresponding to approximately 20 wt.-%), 800 mL/L DEGBE (corresponding to approximately 76 wt.-%), and a compound of formula (Ib) in a total amount of 4 wt.-%, based on the total weight of the respective storage solution. The various pH values were obtained by adding sodium hydroxide or sulfuric acid. The stability was evaluated after 1, 7, and 15 days by carefully determining the presence of any precipitates. During the stability tests, the temperature of each storage solution was 50° C. The results are summarized in the following Table 2.

TABLE 2

| | Duration [d] | | |
|---|---|---|---|
| PH | 1 | 7 | 15 |
| 4 | xx | xx | xx |
| 7 | xx | xx | xx |

TABLE 2-continued

| | Duration [d] | | |
|---|---|---|---|
| PH | 1 | 7 | 15 |
| 10 | x | x | x |
| 11 | 0 | 0 | 0 |
| 12 | 0 | 0 | 0 | xx = strong precipitation;
x = little, insignificant precipitation,
0 = no precipitation Storage solutions with a pH of 4 and 7 are not according to the present invention.

In DEGBE, compounds of formula (Ib) are stable at comparatively high pH and concentrations of approximately 4 wt.-%. This is advantageous because in such a state, compounds of formula (I) can be transported to other manufacturing sites in a still sufficiently high concentration.

Beginning with an alkaline pH, precipitation is significantly reduced and completely dis-appears starting at a pH between 10 and 11. As a result, a clear solution is obtained, which is stable for at last 15 days. Within the pH range from 9 to below 11 (e.g. 10.4) only little precipitation is observed, which can be tolerated depending on further applications.

Thus, concentrations of approximately 4 wt.-% can be sufficiently stabilized at alkaline pH and in the presence of significant amounts of a water miscible organic solvent. If the total amount of water is comparatively low, a respective storage solution is not sufficiently stable at acidic and neutral pH.

C-2ii) Aqueous Working Solution:

In a second stability test, stability of a compound of formula (Ib) also obtained in Example A), 3) was investigated at various pH values but with lower concentration compared to C-2i.

For that purpose, various working solutions (according to the present invention and not according to the present invention) have been prepared each comprising 250 mL/L of storage solution with pH 11 as described above under item C-2i and 750 mL/L water such that the compound of formula (Ib) was present in an total amount of approximately 1 wt.-%, based on the total weight of the respective working solution. The various pH values were obtained by adding sulfuric acid. The stability was evaluated after 14 days by carefully determining the presence of precipitates. During the stability tests, the temperature of each storage solution was kept constant at 50° C. The results are summarized in Table 3.

TABLE 3

| pH 4 | pH 6 | pH 7 | pH 8 | pH 10 |
|---|---|---|---|---|
| xx | 0 | 0 | x | xx | xx = strong precipitation;
x = little, insignificant precipitation,
0 = no precipitation Working solutions with a pH of 4 and 10 are not according to the present invention.

Within the pH range from 4.7 to 8.0 no or only little, insignificant precipitation was observed. Although little precipitation occurred at pH 8 the respective working solution was still acceptable.

However, within the pH range from 4.8 to 7.7 no significant precipitation was observed, wherein best results have been observed at the pH range from 5.5 to 7.4, which is a very preferred pH range, with even better results at a pH in the range from 6.5 to 7.5.

Thus, typical working concentrations of for example 1 wt.-% azole silane compound can be sufficiently stabilized around neutral pH if the solution is aqueous and at least contains 51 wt.-% water as well as one or more than one water miscible organic solvent.

The invention claimed is:

1. An azole silane compound of formula (I)

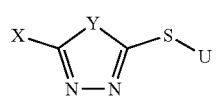
(I)

wherein

X denotes $NH_2$, $NH(NH_2)$, $NH(NHU)$, or NHU,

Y denotes NH, $N(NH_2)$, $N(NHU)$, or S,

U independently denotes $CH_2$—CH(OH)—$CH_2$—O—$(CH_2)_n$—$Si(OR)_3$ with R independently being $(CH_2$—$CH_2$—$O)_m$—Z, wherein independently n is an integer in the range from 1 to 12, m is 0, 1, 2, 3, or 4, and Z denotes H or C1 to C5 alkyl.

2. The compound of claim 1, wherein X denotes $NH_2$.

3. The compound of claim 1, wherein in U n is an integer in the range from 1 to 8.

4. The compound of claim 1, being a compound of formula (Ia) or (Ib)

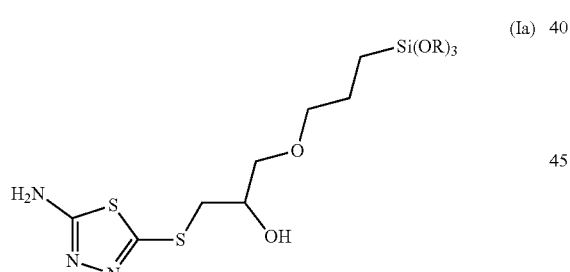
(Ia)

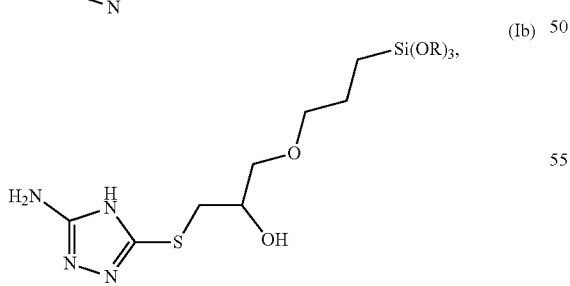
(Ib)

with R independently being $(CH_2$—$CH_2$—$O)_m$—Z, wherein independently m is 0, 1, or 2, and Z denotes H, $CH_3$, $CH_2$—$CH_3$, $(CH_2)_2$—$CH_3$, or $(CH_2)_3$—$CH_3$.

5. A mixture comprising (a)—one or more than one azole silane compound according to claim 1, or one or more than one azole silane oligomer obtained by reacting in the presence of water azole silane compounds according to formula (I)

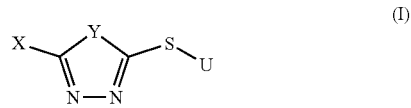
(I)

wherein

X denotes $NH_2$, $NH(NH_2)$, $NH(NHU)$, or NHU,

Y denotes NH, $N(NH_2)$, $N(NHU)$, or S,

U independently denotes $CH_2$—CH(OH)—$CH_2$—O—$(CH_2)_n$—$Si(OR)_3$ with R independently being $(CH_2$—$CH_2$—$O)_m$—Z, wherein independently n is an integer in the range from 1 to 12, m is 0, 1, 2, 3, or 4, and Z denotes H or C1 to C5 alkyl, with each other such that the azole silane oligomer comprises at least one silicon-oxygen-silicon moiety, or both one or more than one said azole silane compound and one or more than one said azole silane oligomer; and (b)—one or more than one organic solvent.

6. An alkaline storage solution comprising (a)—one or more than one azole silane compound according to claim 1, and optionally one or more than one azole silane oligomer obtained by reacting in the presence of water azole silane compounds according to formula (I)

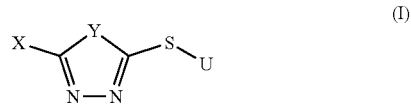
(I)

wherein

X denotes $NH_2$, $NH(NH_2)$, $NH(NHU)$, or NHU,

Y denotes NH, $N(NH_2)$, $N(NHU)$, or S,

U independently denotes $CH_2$—CH(OH)—$CH_2$—O—$(CH_2)_n$—$Si(OR)_3$ with R independently being $(CH_2$—$CH_2$—$O)_m$—Z, wherein independently n is an integer in the range from 1 to 12, m is 0, 1, 2, 3, or 4, and Z denotes H or C1 to C5 alkyl, with each other such that the azole silane oligomer comprises at least one silicon-oxygen-silicon moiety, (b)—water, and (c)—one or more than one water miscible organic solvent, with the proviso that the pH is 9 or higher.

7. The storage solution according to claim 6, wherein in the solution the total amount of all azole silane compounds and all azole silane oligomers together is in the range from 0.5 wt.-% to 15 wt.-%, based on the total weight of the alkaline storage solution.

8. The alkaline storage solution according to claim 7, wherein the one or more than one water miscible organic solvent comprises a water-miscible organic solvent selected from the group consisting of C1 to C4 alcohols, glycol ethers, and mixtures thereof.

9. The alkaline storage solution according to claim 6, wherein the one or more than one water miscible organic solvent comprises a water-miscible organic solvent selected from the group consisting of C1 to C4 alcohols, glycol ethers, and mixtures thereof.

10. An azole silane oligomer obtained by reacting in the presence of water azole silane compounds according to formula (I)

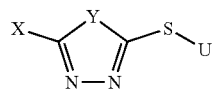

(I)

wherein
X denotes $NH_2$, $NH(NH_2)$, $NH(NHU)$, or NHU, or SU,
Y denotes NH, $N(NH_2)$, N(NHU), or S,
U independently denotes $CH_2$—CH(OH)—$CH_2$—O—$(CH_2)_n$—$Si(OR)_3$ with R independently being $(CH_2$—$CH_2$—$O)_m$—Z, wherein independently
n is an integer in the range from 1 to 12,
m is 0, 1, 2, 3, or 4, and
Z denotes H or C1 to C5 alkyl,
with each other such that the azole silane oligomer comprises at least one silicon-oxygen-silicon moiety.

11. The oligomer according to claim 10, wherein the oligomer is selected from the group consisting of an azole silane dimer, an azole silane trimer, and an azole silane tetramer.

12. The oligomer according to claim 10, wherein the oligomer is a compound of formula (II)

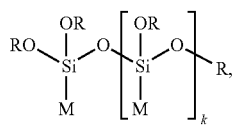

(II)

wherein
R independently denotes $(CH_2$—$CH_2$—$O)_m$—Z, wherein
m is 0, 1, 2, 3, or 4, and
Z denotes H or C1 to C5 alkyl,
k is 1, 2 or 3, and
M independently denotes a moiety of formula (IIa)

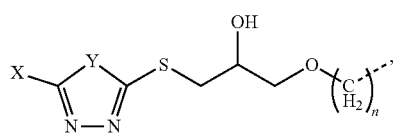

(IIa)

wherein in formula (IIa)
X denotes $NH_2$, $NH(NH_2)$,
Y denotes NH, $N(NH_2)$, or S, and
n denotes an integer in the range from 1 to 12.

13. An aqueous working solution having a pH in the range from 4.8 to 8.0, the solution comprising
(a)—one or more than one azole silane compound according to claim 1, and/or one or more than one azole silane oligomer obtained by reacting in the presence of water azole silane compounds according to formula (I)

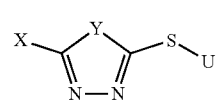

(I)

wherein
X denotes $NH_2$, $NH(NH_2)$, NH(NHU), or NHU,
Y denotes NH, $N(NH_2)$, N(NHU), or S,
U independently denotes $CH_2$—CH(OH)—$CH_2$—O—$(CH_2)_n$—$Si(OR)_3$ with R independently being $(CH_2$—$CH_2$—$O)_m$—Z, wherein independently
n is an integer in the range from 1 to 12,
m is 0, 1, 2, 3, or 4, and
Z denotes H or C1 to C5 alkyl,
with each other such that the azole silane oligomer comprises at least one silicon-oxygen-silicon moiety,
(b)—at least 51 wt.-% water, based on the total weight of said working solution, and
(c)—one or more than one water miscible organic solvent,
wherein in said working solution the total amount of all azole silane compounds and all azole silane oligomers together is 5 wt.-% or less, based on the total weight of the aqueous working solution.

14. A method of preparing a surface comprising a metal, an organic material, or both a metal and an organic material, comprising applying to the surface the aqueous working solution according to claim 13.

15. The aqueous working solution according to claim 13, wherein the one or more than one water miscible organic solvent comprises a water-miscible organic solvent selected from the group consisting of C1 to C4 alcohols, glycol ethers, and mixtures thereof.

16. A synthesis method for an azole silane compound of formula (I)

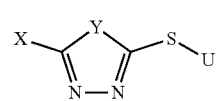

(I)

wherein
X denotes $NH_2$, $NH(NH_2)$, NH(NHU), or NHU,
Y denotes NH, $N(NH_2)$, N(NHU), or S,
U independently denotes $CH_2$—CH(OH)—$CH_2$—O—$(CH_2)_n$—$Si(OR)_3$ with R independently being $(CH_2$—$CH_2$—$O)_m$—Z, wherein independently
n is an integer in the range from 1 to 12,
m is 0, 1, 2, 3, or 4, and
Z denotes C1 to C5 alkyl
the synthesis method comprising the steps of
(i) providing an azole compound of formula (III)

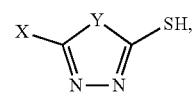

(III)

wherein
X denotes $NH_2$, $NH(NH_2)$,
Y denotes NH, $N(NH_2)$, or S,
(ii) providing a silane compound of formula (IV)

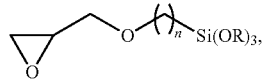

wherein in formula (IV)
R denotes $(CH_2-CH_2-O)_m-Z$, wherein independently m is 0, 1, 2, 3, or 4, and
Z denotes C1 to C5 alkyl, and
n is an integer in the range from 1 to 12,
(iii) reacting in a solvent said azole compound with said silane compound such that above defined compound of formula (I) results, and
(iv) optionally hydrolyzing the compound of formula (I) obtained in step (iii) such that at least one of R is $(CH_2-CH_2-O)_m-Z$ with m=zero and Z=H.

17. The method of claim 16, wherein the total molar ratio of the compound of formula (III) to the compound of formula (IV) is in the range from 1:0.85 to 1:1.3.

* * * * *